(12) United States Patent
Lundström

(10) Patent No.: US 11,584,233 B2
(45) Date of Patent: Feb. 21, 2023

(54) BATTERY ARRANGEMENT FOR ELECTRICALLY POWERED INDUSTRIAL VEHICLE

(71) Applicant: Alelion Energy Systems AB, Mölndal (SE)

(72) Inventor: Dag Lundström, Onsala (SE)

(73) Assignee: Alelion Energy Systems AB, Mölndal (SE)

(*) Notice: Subject to any disclaimer, the term of this patent is extended or adjusted under 35 U.S.C. 154(b) by 0 days.

(21) Appl. No.: 14/901,355

(22) PCT Filed: Jun. 26, 2014

(86) PCT No.: PCT/EP2014/063552
§ 371 (c)(1),
(2) Date: Dec. 28, 2015

(87) PCT Pub. No.: WO2014/207119
PCT Pub. Date: Dec. 31, 2014

(65) Prior Publication Data
US 2016/0149273 A1 May 26, 2016

(30) Foreign Application Priority Data
Jun. 28, 2013 (SE) .................................. 1350803-1

(51) Int. Cl.
*H01M 50/572* (2021.01)
*H01M 50/574* (2021.01)
(Continued)

(52) U.S. Cl.
CPC ........... *B60L 3/0015* (2013.01); *B60L 3/0046* (2013.01); *B60L 3/04* (2013.01); *B60L 3/06* (2013.01);
(Continued)

(58) Field of Classification Search
CPC .. H01M 10/44; H01M 10/446; H01M 10/448; H01M 2010/4271
See application file for complete search history.

(56) References Cited

U.S. PATENT DOCUMENTS

| 3,529,230 A | 9/1970 | Tedd |
| 2002/0092687 A1 | 7/2002 | Forster |

(Continued)

FOREIGN PATENT DOCUMENTS

| CN | 203631419 U | 6/2014 |
| GB | 1155263 A | 6/1969 |

(Continued)

OTHER PUBLICATIONS

"International Application Serial No. PCT/EP2014/063552, International Preliminary Report on Patentability dated Jun. 22, 2015", 11 pgs.

(Continued)

*Primary Examiner* — Cynthia H Kelly
*Assistant Examiner* — Julian Anthony
(74) *Attorney, Agent, or Firm* — Schwegman Lundberg & Woessner, P.A.

(57) ABSTRACT

The present invention relates to a battery arrangement for an electrically powered industrial vehicle. The battery arrangement comprises a battery and ancillary equipment arranged to connect the battery to the vehicle. The battery is removably connected to the vehicle and comprises a current sensor. The battery is in a first state (A) when a measured current out from the battery exceeds a predetermined first current level. In the first state (A) the battery is prevented from turning power off to the vehicle. The battery is in a second state (B) when a measured current out from the battery is below a predetermined first current level for a predetermined first (Continued)

period of time. In the second state (B) the battery is allowed to turn power off to the vehicle.

9 Claims, 2 Drawing Sheets

(51) Int. Cl.
    *H01M 10/42*     (2006.01)
    *B60L 3/00*     (2019.01)
    *B60L 3/04*     (2006.01)
    *B60L 3/06*     (2006.01)
    *B60L 3/12*     (2006.01)
    *B60L 50/60*     (2019.01)
    *B60L 53/80*     (2019.01)
    *B60L 58/14*     (2019.01)
    *H01M 10/48*     (2006.01)
    *G01R 31/3842*     (2019.01)

(52) U.S. Cl.
    CPC ............... *B60L 3/12* (2013.01); *B60L 50/66* (2019.02); *B60L 53/80* (2019.02); *B60L 58/14* (2019.02); *H01M 10/425* (2013.01); *H01M 10/482* (2013.01); *B60L 2200/42* (2013.01); *B60L 2240/12* (2013.01); *B60L 2240/545* (2013.01); *B60L 2240/547* (2013.01); *B60L 2240/549* (2013.01); *B60L 2240/80* (2013.01); *G01R 31/3842* (2019.01); *H01M 2010/4271* (2013.01); *H01M 2220/20* (2013.01); *Y02P 90/60* (2015.11); *Y02T 10/70* (2013.01); *Y02T 10/7072* (2013.01); *Y02T 90/12* (2013.01); *Y02T 90/14* (2013.01)

(56) References Cited

U.S. PATENT DOCUMENTS

| | | | |
|---|---|---|---|
| 2002/0158509 A1 | 10/2002 | Herrmann | |
| 2007/0231626 A1* | 10/2007 | Kurosawa | B60L 11/1851 320/101 |
| 2009/0111015 A1* | 4/2009 | Wood | H01M 50/20 429/164 |
| 2009/0205897 A1* | 8/2009 | Endo | B60K 1/04 180/315 |
| 2012/0116699 A1* | 5/2012 | Haag | B60L 3/0046 702/63 |
| 2013/0119934 A1* | 5/2013 | Suzuki | H02J 7/0016 320/112 |
| 2013/0158914 A1 | 6/2013 | Chen et al. | |
| 2014/0145685 A1* | 5/2014 | Bosch | G01R 31/362 320/162 |
| 2016/0276854 A1* | 9/2016 | Lian | B60L 58/19 |

FOREIGN PATENT DOCUMENTS

| | | |
|---|---|---|
| WO | WO-0179012 A2 | 10/2001 |
| WO | WO-2012038251 A1 | 3/2012 |
| WO | WO-2013035183 A1 | 3/2013 |
| WO | WO-2014207119 | 12/2014 |

OTHER PUBLICATIONS

"International Application Serial No. PCT/EP2014/063552, International Search Report dated Dec. 11, 2014", 3 pgs.
"Chinese Application No. 201680079244.0 Office Action mailed", 26 pgs.
"Indian Application No. 11990/DELNP/2015 Office Action dated Apr. 11, 2019", 5 pgs.

* cited by examiner

BATTERY ARRANGEMENT FOR ELECTRICALLY POWERED INDUSTRIAL VEHICLE

PRIORITY APPLICATIONS

This application is a U.S. National Stage Filing under 35 U.S.C. 371 from International Application No. PCT/EP2014/063552, filed on 26 Jun. 2015, and published as WO2014/207119 on 31 Dec. 2014, which claims the benefit under 35 U.S.C. 119 to Sweden Application No. SE 1350803-1, filed on 28 Jun. 2013; which applications and publications are incorporated herein by reference in their entireties.

TECHNICAL FIELD

The present invention relates to a battery arrangement for electrically powered industrial vehicle. The battery arrangement is removably connected to the vehicle. The battery arrangement comprises a current sensor.

BACKGROUND ART

Electrically powered industrial vehicles such as forklifts use one or more batteries for powering the various systems of the vehicle. The battery or batteries are connected to the forklift by means of a battery arrangement comprising the battery and ancillary equipment.

Today's forklifts may use lead-acid batteries. Lead-acid batteries have a range of specific needs for them to operate properly such as maintaining the water level in the cells, short cycle life of the battery cell, relatively low allowable charge rates.

One way of improving the situation is to use lithium-ion batteries instead of lead-acid batteries. This will, if done right, decrease the maintenance of the batteries, i.e. no watering is needed, the cycle life in such batteries are longer and much higher charge rates are allowed. The biggest drawback of today is often the cost of the lithium-ion batteries. This increases the need to protect the batteries from over discharging which can permanently damage the batteries.

A common solution therefore is to include an automatic shutoff mechanism. This mechanism will protect the battery arrangement from being destroyed. The problem with turning the battery arrangement off from the user/forklift while in use is that the forklift might behave unpredictably or dangerously. For example the user might be driving in high speed and suddenly lose traction and many forklifts will have an automatic break system turned on. This will result in a tentatively dangerous situation.

There is thus a need for an improved battery arrangement for electrically powered industrial vehicles.

SUMMARY OF THE INVENTION

The present invention relates to a battery arrangement for electric powering of an industrial vehicle. The battery arrangement is removably connectable to the vehicle and comprises a current sensor. The battery arrangement can be set to a first state wherein the battery arrangement is prevented from turning power off to the vehicle. The battery arrangement can be set to a second state wherein the battery arrangement is allowed to turn power off to the vehicle.

An advantage of the invention is that disconnection of the battery arrangement from the electrically powered industrial vehicle at time where damage to property or persons is prevented, thereby reducing the risk of the vehicle and/or the operator of the vehicle. At certain times it is desirable to be able to disconnect the battery arrangement in order to protect the battery arrangement.

The battery arrangement may comprise a current sensor. The battery arrangement is in the first state when a measured current out from the battery arrangement exceeds a predetermined first current level. The battery arrangement is in the second state when a measured current out from the battery arrangement is below a predetermined first current level for a predetermined first period of time.

By having a battery arrangement comprising a current sensor the battery arrangement itself can determine when it is safe to turn the power off to the vehicle. Turning the power off at a time when the vehicle is in use or having power connected at a time when the battery arrangement should be replaced may cause damage to the battery arrangement, the vehicle and/or the operator of the vehicle. This is for instance the case when the vehicle is provided with spring loaded break systems which will engage automatically when power is disconnected from the vehicle.

The present invention solves this problem by integrating a current sensor in the battery arrangement which allows for determination of the battery arrangement when it is safe for the battery arrangement to switch power off to the vehicle.

A battery arrangement according to the invention can for instance be a Lithium-ion battery comprising a number of battery cells which stores the electrical energy and ancillary equipment. The ancillary equipment of the battery arrangement comprises a battery management system (BMS) which monitors the cells of the battery and the state of charge. The BMS is further arranged to disconnect the battery arrangement from the electrically powered industrial vehicle during use or charge in order to protect the battery arrangement. The ancillary equipment further comprises breakers such as relays or power transistors used to disconnect the battery arrangement from the electrically powered industrial vehicle. Further, one or more current sensors measuring current to and from the battery arrangement and sensors measuring voltage and temperature of the cells are also part of the ancillary equipment.

By electrically powered industrial vehicle is for instance meant various kinds of forklifts, construction vehicles and towing vehicles for baggage handling, loaders and airplanes which run on electrical power provided from a battery arrangement.

The first state can be a state in which the battery arrangement is intended to supply the vehicle with a large amount of electrical power and can therefore not be allowed to disconnect from the vehicle. The first state is intended to be used to provide the forklift with high power during traction or lifting.

The second state can be a state to which the battery arrangement can change from the first state when a measured current out from the battery arrangement is below a predetermined first current level for a predetermined first period of time. The second state is intended to be active during idling or standby when the power provided is used to run instruments. Power is still provided to the vehicle but a much lower level than in the first state.

The predetermined first current level out from the battery may be between 3 Ampere and 30 Ampere, specifically 8-12 Ampere. The predetermined first period of time may be between 3 seconds and 60 seconds, specifically 5-20 seconds.

The battery arrangement may comprise a lithium-ion battery, a sodium-ion battery or a potassium-ion battery. The present invention is suitable for any battery arrangement with a battery which may be damaged by being discharged below certain levels. Other examples of batteries for which the invention is suitable are nickel-metal hydride batteries or lead batteries.

The battery arrangement may further be in the first state when a measured current into the battery arrangement exceeds a predetermined second current level, and wherein the battery arrangement is in the second state when a measured current into the battery arrangement is below a predetermined second current level for a predetermined second period of time. This is advantageous for knowing when it is safe to replace the battery arrangement during charging of the battery arrangement. It also prevents disconnection of the battery arrangement during times when a regenerative current from the vehicle flows into the battery arrangement. Regenerative currents may flow into the battery for instance during braking of the vehicle in order to transform the vehicle's kinetic energy into electrical energy.

The predetermined second current level into the battery is between 3 Ampere and 30 Ampere, specifically 8-12 Ampere and the predetermined second period of time is between 3 seconds and 60 seconds, specifically 5-20 seconds.

It is possible for the first and second current to be different. In one example, the first current I is 10 A and the second current I' is 5 A.

The battery arrangement is arranged to provide electrical power to an electrical motor arranged for propulsion of an electrically powered industrial vehicle. The battery arrangement can by means of the motor arranged for propulsion or by means of other motors also provide power to various functions of the industrial vehicle such as providing power for the vehicles peripheral equipment.

The values for the first and second currents are examples suitable to describe a situation for one type of industrial vehicle. Ultimately, the kind of industrial vehicle together with the use of the industrial vehicle is what determines the specific value for the first and second current levels.

The invention further relates to a method for operation of a battery arrangement in an electrically powered industrial vehicle. The battery arrangement is removably connectable to the vehicle. The method comprises
  setting the battery arrangement to a first state (A), wherein the battery is prevented from turning power off to the vehicle, and
  setting the battery arrangement to a second state (B), wherein the battery arrangement is allowed to turn power off to the vehicle.

The battery arrangement may comprise one or more current sensors, wherein the method further comprises
  setting the battery arrangement in the first state (A), when a measured current (Iout) out from the battery arrangement exceeds a first current level (I) threshold,
  setting the battery arrangement in the second state (B), when a measured current (Iout) out from the battery arrangement is below a first current level (I) threshold during a first period of time (T).

When the battery arrangement comprises one or more current sensors, the method may further comprise
  setting the battery arrangement in the first state (A) when a measured current (Iin) into the battery arrangement exceeds a second current level (I') threshold,
  setting the battery arrangement in the second state (B) when a measured current (Iin) into the battery arrangement is below the second current level (I') threshold during a second period of time (T').

The method according to the invention has the same advantages as presented above.

DETAILED DESCRIPTION

Figure 1:
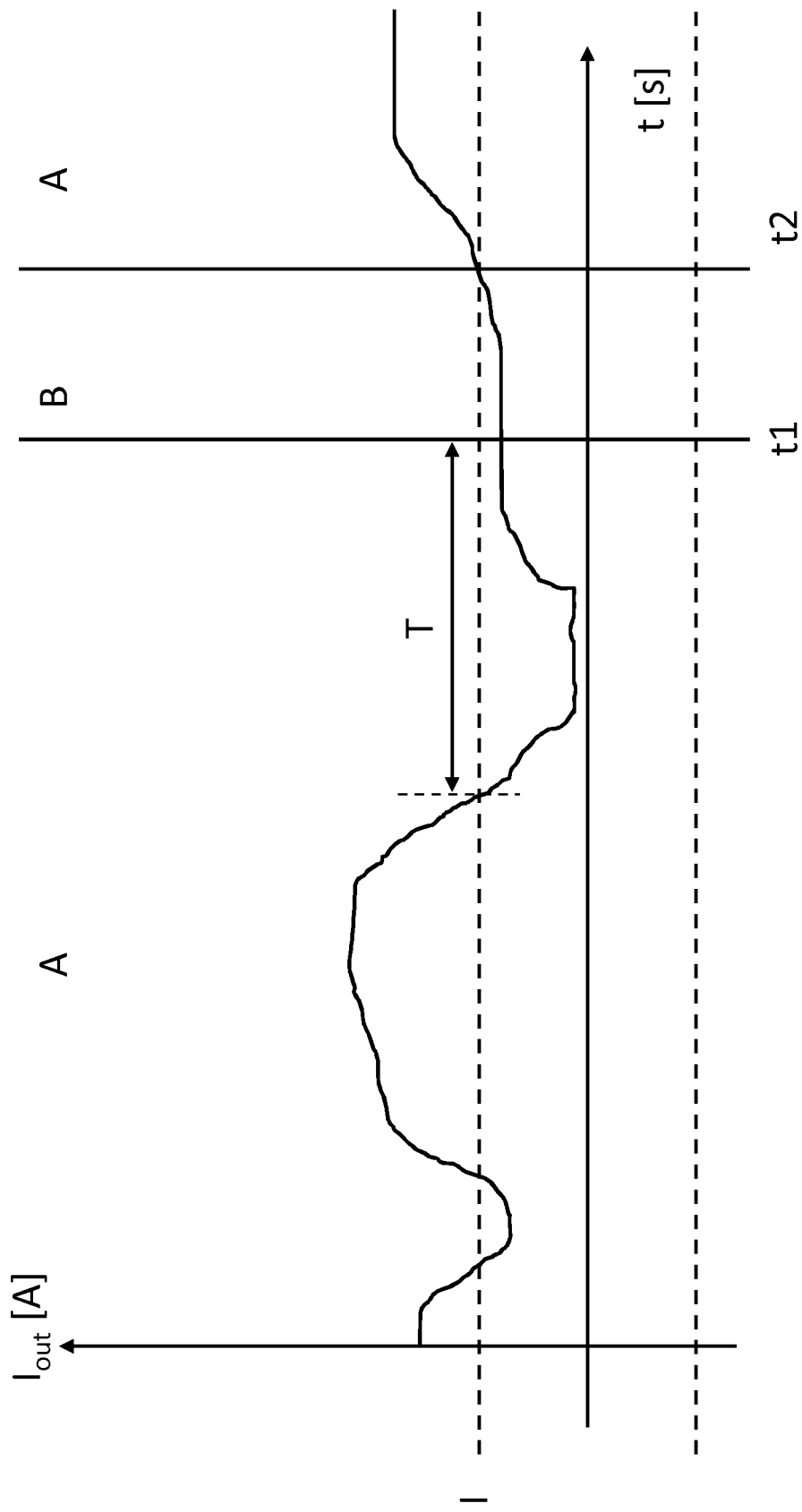
FIG. 1 schematically shows a diagram for current vs time illustrating the present invention.

FIG. 1 schematically shows a diagram for current vs time illustrating the present invention. In FIG. 1 a measured current out from the battery arrangement, Iout, measured in Amperes (A) is shown on the y-axis and time t, measured in seconds (s) is shown on the x-axis.

As can be seen from FIG. 1, the battery arrangement switches from the first state A to second state B at time t1 after a predetermined period of time T where the measured current out from the battery arrangement is lower than a predetermined first current I. In the second state B it is safe to disconnect the power to the vehicle from the battery arrangement. In FIG. 1 the battery arrangement switches back to first state A as soon as the measured current exceeds the predetermined first current I. This occurs at time t2.

Figure 2:
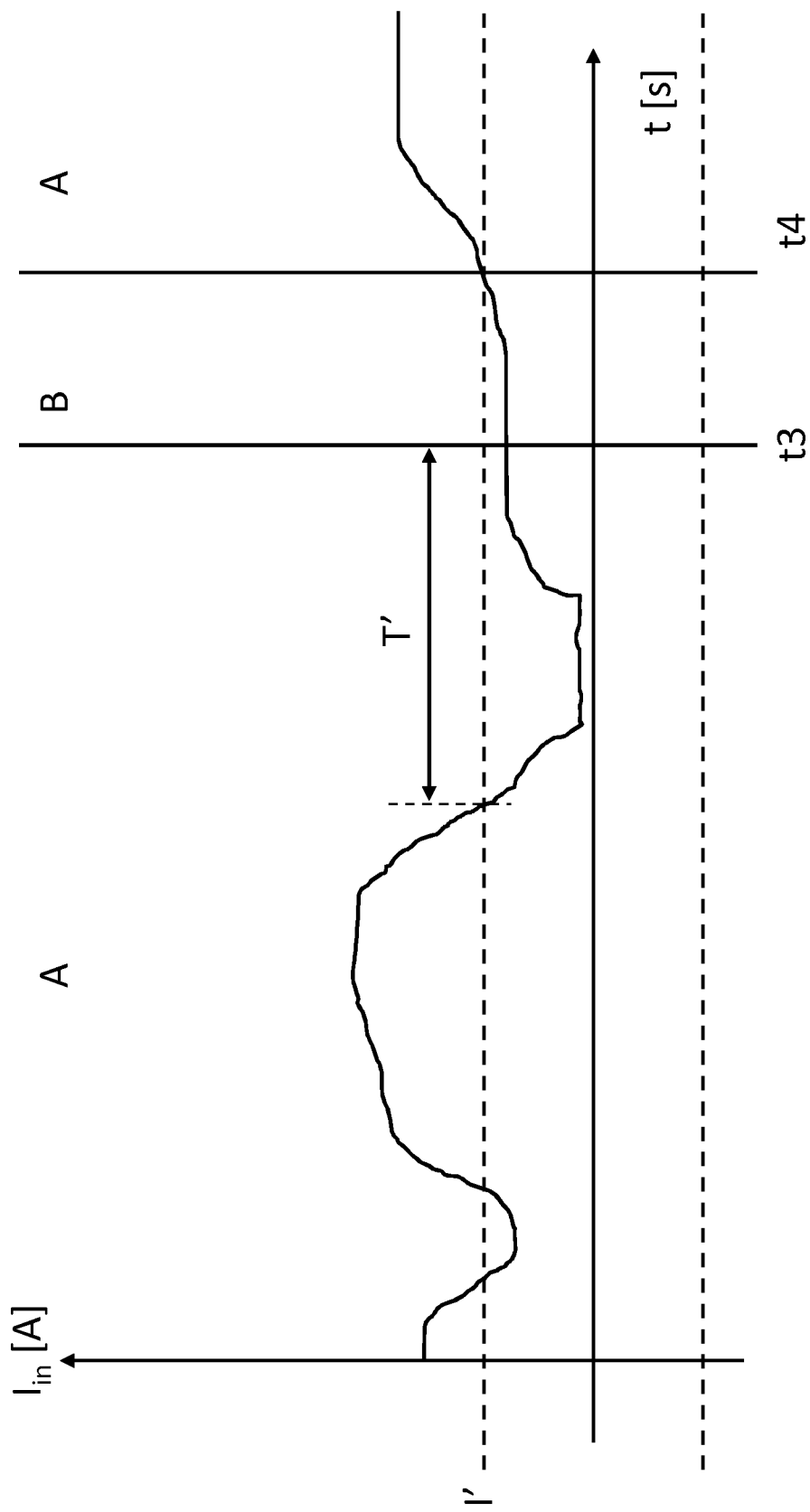
FIG. 2 schematically shows a diagram for current vs time illustrating the present invention.

FIG. 2 schematically shows a diagram for current vs time illustrating the present invention. The description for the measured current out from the battery arrangement, as seen in FIG. 1, is valid also for the embodiment when a current into the battery arrangement, Iin, is measured. In this case, the battery arrangement switches from the first state A to the second state B at time t3 after a predetermined period of time T' where the measured current into the battery arrangement is below a predetermined second current I'. In the second state B it is safe to disconnect the power to the vehicle from the battery arrangement. In FIG. 2 the battery arrangement switches back to the first state A as soon as the measured current Iin exceeds the predetermined second current I'. This occurs at time t4.

In one specific example the first and second currents I and I' are 10 A and the predetermined first and second periods of time T and T' are 5 seconds.

Another way of describing the invention is that the battery arrangement is in or switches to the first state when the absolute value of current being measured by the current sensor exceeds a predetermined current and that the battery arrangement switches to the second state when the absolute value of the current drops below a predetermined current.

The current diagrams in FIGS. 1 and 2 are not to be seen as typical for the operation of the invention. They are merely intended to illustrate the operation of the battery.

Reference signs mentioned in the claims should not be seen as limiting the extent of the matter protected by the claims, and their sole function is to make claims easier to understand.

As will be realised, the invention is capable of modification in various obvious respects, all without departing from the scope of the appended claims. Accordingly, the drawings and the description thereto are to be regarded as illustrative in nature, and not restrictive.

The invention claimed is:

1. A battery arrangement for electric powering of an industrial vehicle, the battery arrangement comprising:
  a set of battery cells configured to store electrical energy;

a battery management system;

breakers configured to be controlled by the battery management system; and one or more current sensors configured to measure at least one of current flow into (Iin) and current flow out (Iout) from the battery arrangement:

wherein the battery arrangement is removably connectable to the vehicle by the breakers under control of the battery management system;

wherein the battery management system is configured to prevent a disconnect of the connected battery arrangement in a first state (A) occurring when either:

a measured current (Iout) out from the battery arrangement has exceeded a first current level (I) threshold, and the battery management system preventing the disconnect until the measured current (Iout) out from the battery arrangement has been below the first current level (I) threshold during a first period of time (T), or:

a measured current (Iin) into the battery arrangement has exceeded a second current level (I') threshold, and the battery management system preventing the disconnect until the measured current (Iin) into the battery arrangement is below the second current level (I') threshold during a second period of time (T').

2. The battery arrangement according to claim 1, wherein the first current level (I) threshold is between 3 Ampere and 30 Ampere and the first period of time (T) is between 3 seconds and 60 seconds.

3. The battery arrangement according to claim 1, wherein the second current level (I') threshold is between 3 Ampere and 30 Ampere and the second period of time (T') is between 3 seconds and 60 seconds.

4. The battery arrangement according to any one of claims 1-2, wherein the battery arrangement comprises a lithium-ion battery, a nickel-metal hydride battery or a lead battery.

5. The battery arrangement of claim 1, wherein the battery arrangement is part of the electrically powered industrial vehicle.

6. The battery arrangement according to claim 1, wherein the first current level (I) threshold is between 8 Amperes and 12 Amperes and the first period of time (T) is between 5 seconds and 20 seconds.

7. The battery arrangement according to claim 1, wherein the second current level (I') threshold is between 8 Amperes and 12 Amperes and the second period of time (T') is between 5 seconds and 20 seconds.

8. The battery arrangement according to claim 1, wherein the battery arrangement further comprises sensors configured to measure voltage and temperature of the battery cells.

9. A method for operation of a battery arrangement in an electrically powered industrial vehicle, the battery arrangement comprising a set of battery cells configured to store electrical energy, a battery management system, breakers configured to be controlled by the battery management system to removably connect the battery arrangement to the vehicle, and one or more current sensors configured to measure at least one of current flow into (Iin) and current flow out from (Iout) the battery arrangement, wherein the method comprises:

measuring, by the one or more current sensors, at feast one of current flow into (Iin) and current flow out from (Iout) the battery arrangement; and preventing, the battery management system, a disconnect of a connected battery arrangement in a first state (A) occurring when either:

a measured current (Iout) out from the battery arrangement exceeds a first current level (I) threshold and the battery management system preventing the disconnect until the measured current (Iout) out from the battery arrangement has been below the first current (I) threshold during a first period of time (T), or a measured current (Iin) into the battery arrangement has exceeded a second current level (I') threshold and the battery management system preventing the disconnect until the measured current (Iin) into the battery arrangement is below the second current level (I') threshold during a second period of time (T').

\* \* \* \* \*